United States Patent
Shim

(10) Patent No.: US 7,646,074 B2
(45) Date of Patent: Jan. 12, 2010

(54) IMAGE SENSOR AND METHOD FOR MANUFACTURING THE SAME

(75) Inventor: Cheon-Man Shim, Yeongdeungpo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/122,757

(22) Filed: May 19, 2008

(65) Prior Publication Data

US 2008/0290437 A1 Nov. 27, 2008

(30) Foreign Application Priority Data

May 23, 2007 (KR) .................... 10-2007-0050347

(51) Int. Cl.
*H01L 31/0232* (2006.01)
*H01L 21/00* (2006.01)

(52) U.S. Cl. ........................................ 257/432; 438/70
(58) Field of Classification Search ................ 257/432, 257/70, 40, 30, 288, E31.127, E21.422, E21.209, 257/E21.69; 438/666, 48, 57, 83; 136/263, 136/243, 252, 256, 255
See application file for complete search history.

(56) References Cited

U.S. PATENT DOCUMENTS

| | | | |
|---|---|---|---|
| 6,657,306 B1 * | 12/2003 | Sasaki et al. ................ 257/773 |
| 6,841,411 B1 | 1/2005 | Varghese | |
| 7,227,575 B2 * | 6/2007 | Murayama et al. .......... 348/294 |
| 2003/0189235 A1 * | 10/2003 | Watanabe et al. ........... 257/432 |
| 2005/0217722 A1 * | 10/2005 | Komatsu et al. ............ 136/263 |
| 2007/0063156 A1 * | 3/2007 | Hayashi ................. 250/559.07 |

OTHER PUBLICATIONS

Battacharyya et al., "Photovoltaic Properties of Dye Functionalized Single-Wall Carbon Nanotube / Conjugate Polymer Devices", 2004, Chem. Meter., vol. 16, pp. 4819-4823.*
Tu et al., "Single-walled and multiwalled carbon nanotube . . . ", 2002, Phys. Rev., vol. 65, pp. 233407-1-4.*
"Photovoltaic Properties of Dye Functionalized Single-Wall Carbon Nanotube/Conjugated Polymer Devices," Chem. Mater., vol. 16, pp. 4819-4823 (2004).

* cited by examiner

*Primary Examiner*—Thomas L Dickey
*Assistant Examiner*—Nikolay Yushin
(74) *Attorney, Agent, or Firm*—Sherr & Vaughn, PLLC

(57) ABSTRACT

An image sensor that includes a contact plug formed in the substrate; a lower electrode formed on the contact plug; a photo diode formed on the lower electrode, the photo diode having a carbon nanotube provided therein; and an upper electrode formed on the photo diode. The photo diode can function as a color photo diode 160 that can transfer electrons or holes using the carbon nanotube while also functioning as a color filter.

14 Claims, 4 Drawing Sheets

IMAGE SENSOR AND METHOD FOR MANUFACTURING THE SAME

The present application claims priority under U.S.C. § 119 to Korean Patent Application No. 10-2007-0050347 (filed May 23, 2007), which is hereby incorporated by reference in its entirety.

BACKGROUND

A CMOS image sensor may be divided into a photo diode region for receiving light signals to convert them into electric signals, and a transistor region for processing the electric signals. CMOS image sensors may have a structure where the photo diode is horizontally disposed relative to the transistor. Of course, although the disadvantage of a CCD image sensor may be overcome by using a lateral CMOS image sensor, the lateral CMOS image sensor still has its disadvantages. In other words, with a lateral CMOS image sensor, the photo diode and the transistor may be manufactured to be horizontally adjacent to each other on a substrate. Therefore, an additional region for the photo diode is required, thereby causing problems by reducing a fill factor region and limiting the possibility of resolution. Also, the lateral CMOS image sensor is very difficult to accomplish optimization during a process for simultaneously manufacturing the photo diode and the transistor.

SUMMARY

Embodiments relate to an image sensor and a method for manufacturing the same which provides for new integration of transistor circuitry and a photo diode.

Embodiments relate to an image sensor and a method for manufacturing the same having a longitudinally displaced photo diode that enhances driving speed of a semiconductor device.

Embodiments relate to an image sensor and a method for manufacturing the same that enhances both resolution and sensitivity.

Embodiments relate to an image sensor and a method for manufacturing that prevents defect within a longitudinal photo diode.

Embodiments relate to an image sensor that can include at least one of the following: circuitry formed on and/or over a substrate; a contact plug formed in and extending through the substrate; a lower electrode formed on and/or over and contacting the contact plug; a photo diode including a carbon nanotube formed on and/or over and contacting the lower electrode; and an upper electrode formed on and/or over and contacting the photo diode.

Embodiments relate to a method for manufacturing an image sensor that can include at least one of the following steps: forming circuitry on and/or over a substrate; and then forming a contact plug in the substrate; and then forming a lower electrode on and/or over the contact plug; and then forming a photo diode including a carbon nanotube on and/or over the lower electrode; and then forming an upper electrode on and/or over the photo diode.

DRAWINGS

Figure 1:
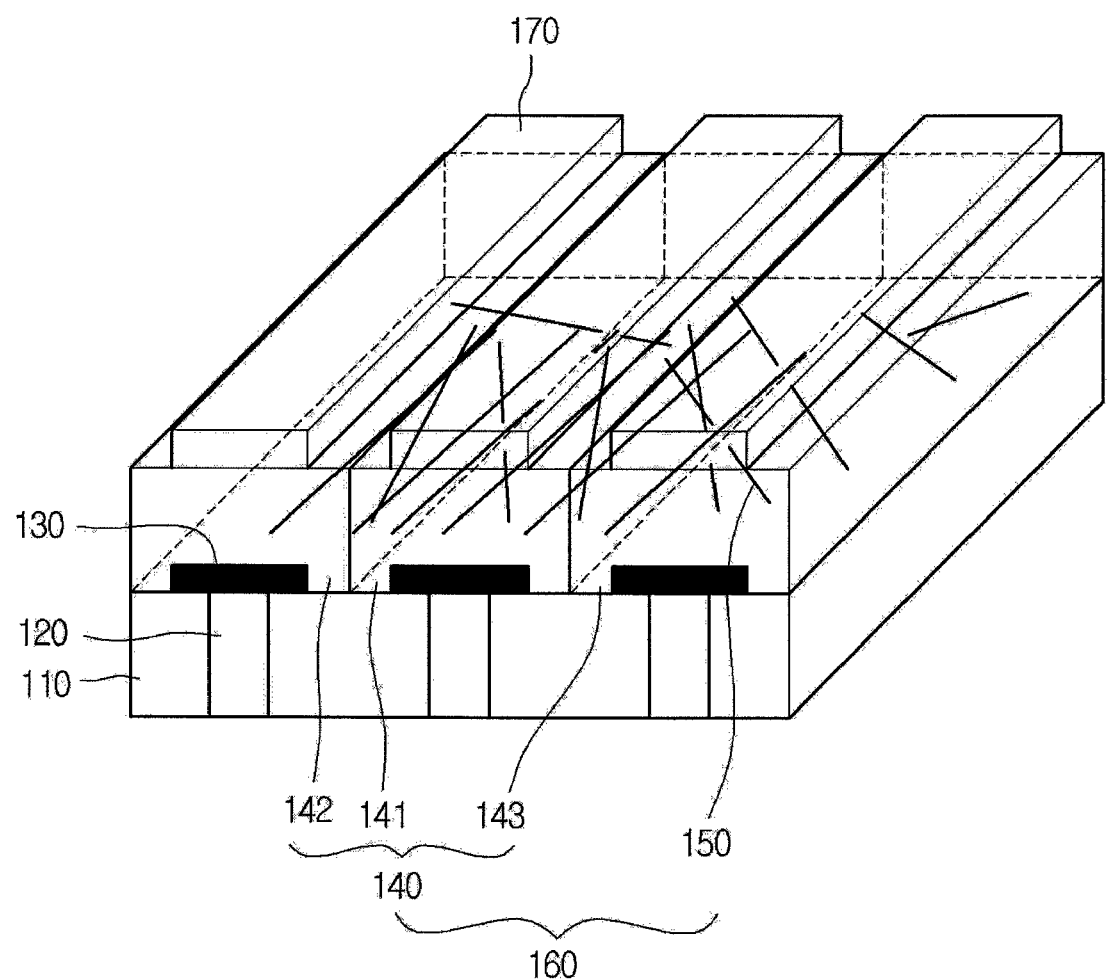
Figure 2:
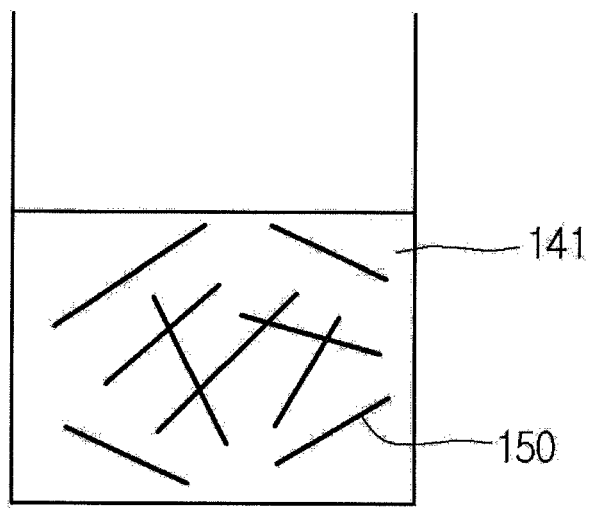
Figure 3:
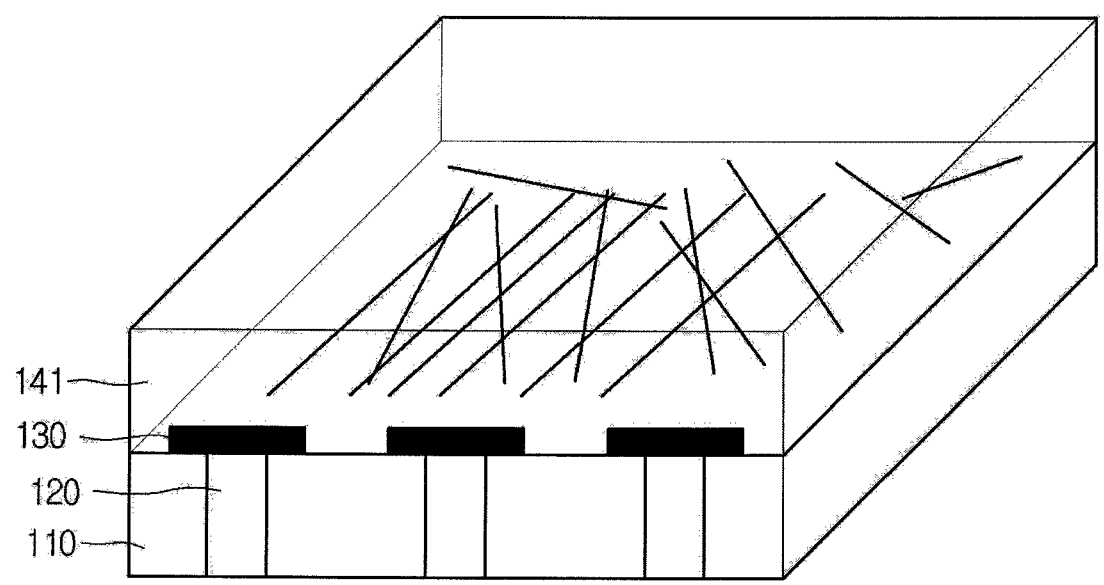

Example FIG. 1 illustrates an image sensor, in accordance with embodiments.

Example FIGS. 2 to 5 illustrates a method for manufacturing an image sensor, in accordance with embodiments.

DESCRIPTION

In the description of embodiments, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being 'between' two layers, it can be the only layer between the two layers, or one or more intervening layers may also be present.

As illustrated in example FIG. 1, an image sensor can include: circuitry formed on and/or over substrate 110. Contact plug 120 can be formed in and extend through substrate 110. Lower electrode 130 can be formed on and/or over and contacting contact plug 120. Photo diode 160 including carbon nanotube 150 can be formed on and/or over and contacting semiconductor substrate 110 and lower electrode 130. Upper electrode 170 can be formed on and/or over and contacting photo diode 160.

The image sensor in accordance with embodiments can provide an image sensor having a photo diode that includes a plurality of carbon nanotubes, while adopting a longitudinal photo diode. Also, the image sensor in accordance with embodiments provides rapid mobility of electrons or holes by using a photo diode having a plurality of carbon nanotubes, making it possible to improve the driving speed of a device. For example, photo diode 160 can be formed as a color photo diode that includes color die 140 that carbon nanotube 150 is blended.

As illustrated in example FIG. 1, color photo diode 160 can also include first color die 141 formed on and/or over lower electrode 130 and into which carbon nanotube 150 is blended, second color die 142 formed on one side of first color die 141 and into which carbon nanotube 150 is blended, and third color die 142 formed on the other side of first color die 141 and into which carbon nanotube 150 is blended. In other words, color photo diode 160 can transfer electrons or holes using carbon nanotube 150 and can also function as a color filter. For example, color photo diode 160 can include red color die 141 formed on and/or over lower electrode 130 and into which carbon nanotube 150 is blended, green color die 142 formed on one side of red color die 141 and into which carbon nanotube 150 is blended, and blue color die 143 formed on the other side of red color die 141 and into carbon nanotube 150 is blended.

In accordance with embodiments, carbon nanotube 150 can have a weight ratio of 0.1 to 10% as compared to color die 140. For instance, when the weight ratio of carbon nanotube 150 is less than 0.1%, it cannot transfer the electrons or the holes. On the other hand, when the weight ratio of carbon nanotube 150 is more than 10%, a blending thereof is difficult and can cause interruptions in light transmission of color die 140, and thus, cannot function as a color filter.

In accordance with embodiments, the process of transferring electrons using carbon nanotube 150 can occur is as follows. Electrons and holes can be generated in color die 140 by external light, whereby the electrons can be easily and rapidly transferred to lower electrode 130 through carbon nanotube 150. In accordance with embodiments, carbon nanotube 150 can be formed having both metallic and semiconductive properties, depending upon the structure thereof.

In accordance with embodiments, carbon nanotube 150 can be 50 nm to 2 μm in length. For example, carbon nanotube 150 having a length of about 50 nm can be used when a pixel size is very small (micro). On the other hand, carbon nanotube 150 having a length of about 2 μm can be used when a pixel size is relatively large, thereby making it possible to contribute to yield improvement.

In accordance with embodiments, carbon nanotube 150 can be 0.4 nm to 10 nm in thickness. For example, carbon nanotube 150 can have a thickness of about 0.4 nm when it is a single-wall. Carbon nanotube 150 can have a thickness of about 10 nm when it is a multi-wall. When carbon nanotube 150 is a multi-wall, it can have a circular cylindrical shape or a multilateral shape by many folds. Also, when carbon nanotube 150 is formed as a single-wall, it can have a circular cylindrical shape or a multilateral shape that is a single pillar.

As illustrated in example FIGS. 2 to 5, a method of manufacturing the image sensor illustrated in example FIG. 1 can include forming circuitry on and/or over substrate 110. The circuitry can be CMOS circuitry, however, it is not limited thereto. Contact plug 120 can then be formed in and extending through substrate 110. Lower electrode 130 can then be formed on and/or over contact plug 120 to thereby form a longitudinal integration of transistor circuitry and a photo diode.

Photo diode 160 including a plurality of carbon nanotube 150 can then be formed on and/or over and contacting lower electrode 130. In accordance with embodiments, photo diode 160 can be formed as a color photo diode. For example, color photo diode 160 can include color die 140 into which a plurality of carbon nanotube 150 is blended. As illustrated in example FIGS. 2 and 3, color photo diode 160 can include first color die 141 formed on and/or over lower electrode 130, first color die 141 having a plurality of carbon nanotube 150 provided therein.

Figure 4:
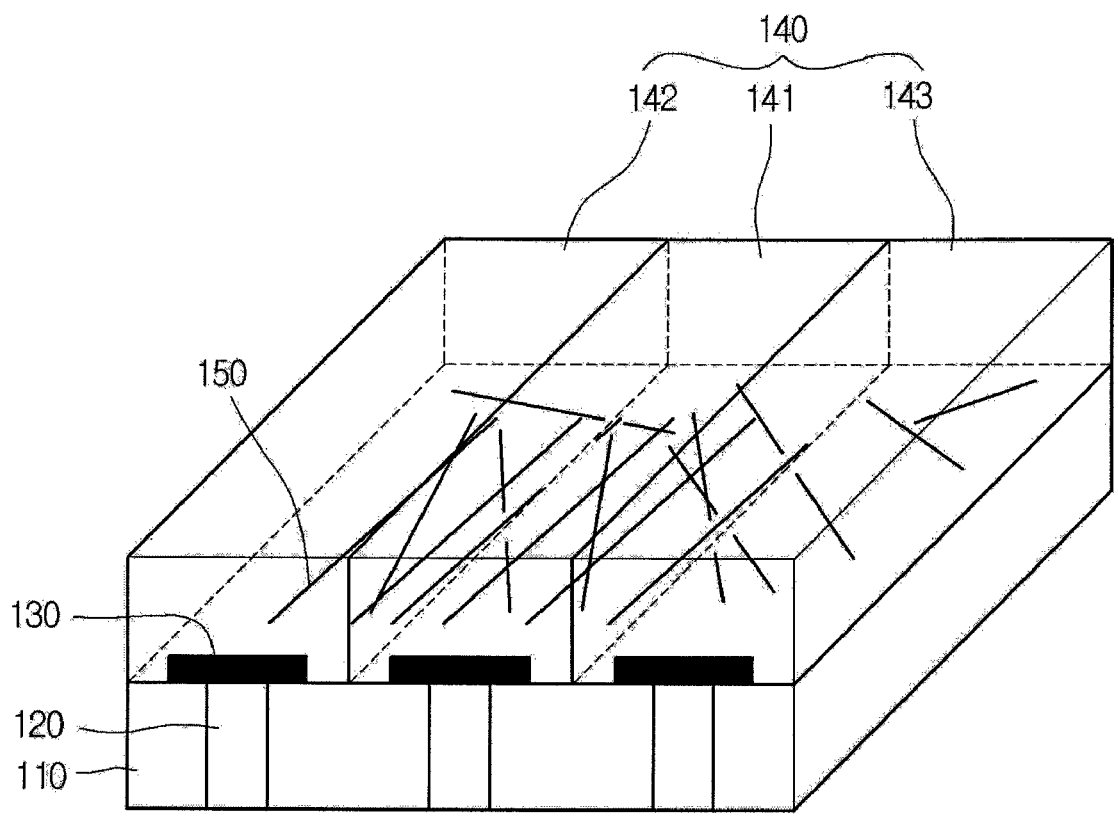

As illustrated in example FIG. 4, first color die 141 can then be patterned. Second color die 142 having a plurality of carbon nanotube 150 can then be formed on one side of first color die 141. Second color die 142 can then be patterned. Third color die 143 having a plurality of carbon nanotube 150 can then be formed on the other side of first color die 141. Third color die 143 can then be patterned. In accordance with embodiments, color die 140 having a plurality of carbon nanotube 150 can be made of a conductive polymeric material such as a conjugated polymer. For example, color die 140 can be formed using polythiophene or a derivative thereof such as poly (3,4-ethylenedioxythiophene), polyaniline, polypyrrole and polymer that is formed of a derivative thereof, or a polymer having a conjugated structure, etc.

In accordance with embodiments, color photo diode 160 can transfer electrons or holes using carbon nanotube 150 and can also function as a color filter using color die 140. For example, color photo diode 160 can include red color die 141 having a plurality of carbon nanotube 150, green color die 142 having a plurality of carbon nanotube 150 formed on one side of red color die 141, and blue color die 143 having a plurality of carbon nanotube 150 formed on the other side of red color die 141.

In accordance with embodiments, carbon nanotube 150 can have a weight ratio of 0.1 to 10% as compared to color die 140. When the weight ratio of carbon nanotube 150 is less than 0.1%, it cannot effectively transfer the electrons or the holes. When the weight ratio of carbon nanotube 150 is more than 10%, a blending thereof is difficult and can interrupt light transmission of color die 140, and thus, prevents color die 140 form functioning as a color filter.

In accordance with embodiments, carbon nanotube 150 can be 50 nm to 2 μm in length. For example, carbon nanotube 150 of about 50 nm can be used when a pixel size is very small (micro). Carbon nanotube 150 of about 2 μm can be used when a pixel size is relatively large, thereby making it possible to contribute to yield improvement.

In accordance with embodiments, carbon nanotube 150 can be 0.4 nm to 10 nm in thickness. For example, carbon nanotube 150 can have a thickness of about 0.4 nm when it is a single-wall and can have a thickness of about 10 nm when it is a multi-wall. When carbon nanotube 150 is a multi-wall, it can have a circular cylindrical shape or a multilateral shape having many folds. When carbon nanotube 150 is a single-wall, it can have a circular cylindrical shape or a multilateral shape that having a single pillar.

Figure 5:
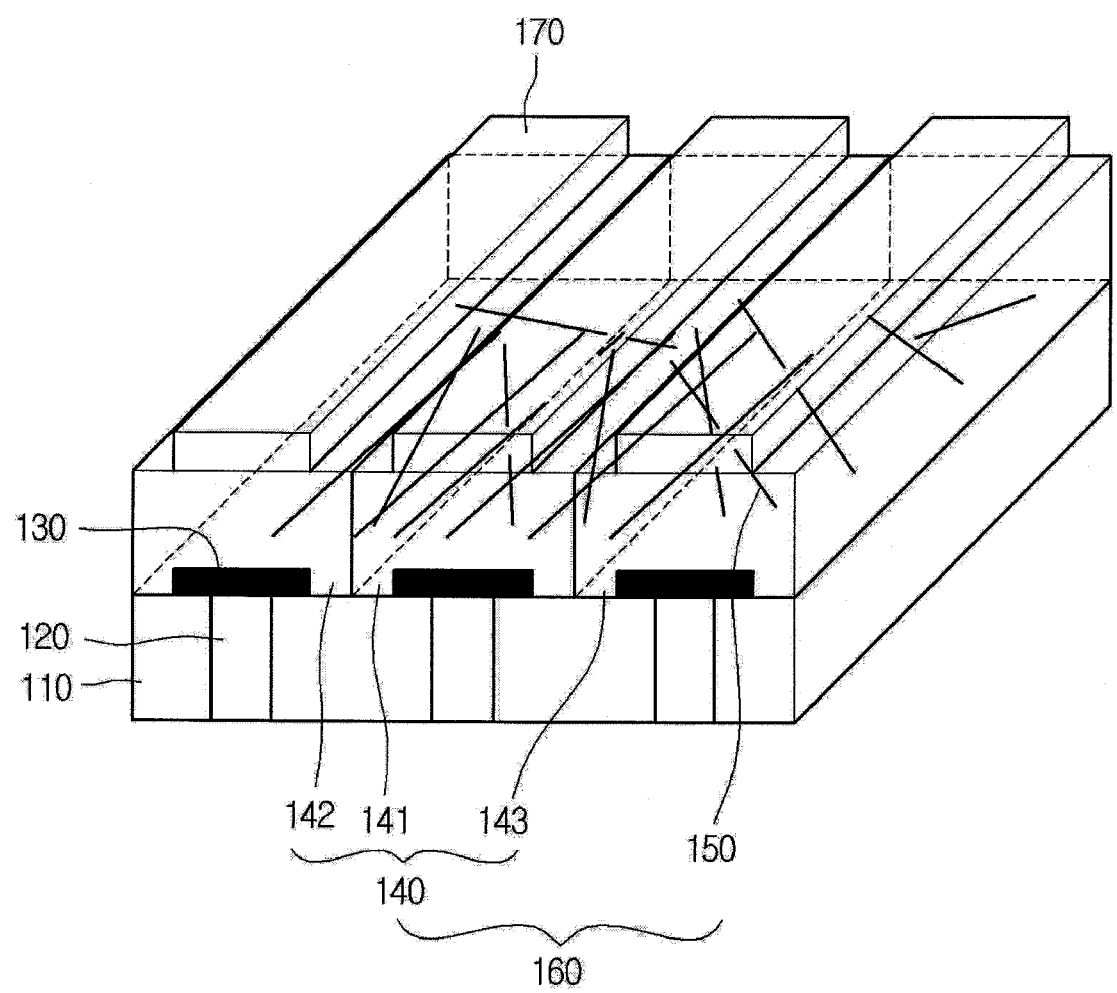

As illustrated in example FIG. 5, upper electrode 170 can then be formed on and/or over and contacting color photo diode 160. Upper electrode 170 can be a transparent electrode.

The image sensor in accordance with embodiments can provide the longitudinal integration of transistor circuitry with a photo diode. The image sensor in accordance with embodiments can also provide an image sensor having a photo diode that incorporates a plurality of carbon nanotubes, while adopting a longitudinal photo diode. The image sensor in accordance with embodiments provides rapid mobility of electrons or holes by using a photo diode that incorporates a plurality of carbon nanotubes, making it possible to improve the driving speed of a device. The image sensor in accordance with embodiments can also approach a fill factor to 100% by using longitudinal integration of a transistor circuitry with a photo diode. The image sensor in accordance with embodiments can provide a high sensitivity in a pixel having the same size as other image sensors by using such longitudinal integration. The image sensor in accordance with embodiments can reduce process costs for the same resolution as compared to other image sensors.

In the image sensor manufactured in accordance with embodiments, each unit pixel can implement a more complex circuitry without a reduction in sensitivity. Also, an additional on-chip circuitry that can be integrated in embodiments can increase performance of the image sensor and furthermore, can accomplish miniaturization of devices and reduction in manufacturing costs thereof. Also, embodiments can prevent defects within a photo diode while adopting a longitudinal photo diode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   contact plugs formed in a substrate;
   lower electrodes including a first lower electrode, a second lower electrode and a third lower electrode formed on and contacting a respective one of the contact plugs;
   a color photo diode including a first color die formed on and contacting the first lower electrode at an uppermost surface and lateral sidewalls thereof, a second color die formed on and contacting the second lower electrode at an uppermost surface and lateral sidewalls thereof, and a third color die formed on and contacting the third lower electrode at an uppermost surface and lateral sidewalls thereof, each color die having a carbon nanotube provided therein; and
   upper electrodes formed on and contacting the color photo diode.

2. The image sensor of claim 1, wherein the carbon nanotube has at least one of a multi-wall and a single-wall.

3. The image sensor of claim 1, wherein each carbon nanotube has a weight ratio of 0.1 to 10% as compared to a respective one of the first, second and third color dies.

4. The image sensor of claim 1, wherein each carbon nanotube is 50 nm to 2 μm in length.

5. The image sensor of claim 1, wherein each carbon nanotube is 0.4 nm to 10 nm in wall thickness.

6. The image sensor of claim 1, wherein the carbon nanotube is 50 nm to 2 μm in length and 10 nm to 10 nm in wall thickness.

7. A method for manufacturing an image sensor comprising:
   forming contact plugs in a substrate; and then
   forming lower electrodes spaced apart from each other and on and contacting a respective one of the contact plugs; and then
   forming a color photo diode comprising a first color die formed on and contacting the substrate, a second color die formed on and contacting the substrate and also contacting the first color die at a sidewall of the first color die, and a third color die formed on and contacting the substrate and also contacting the first color die at another sidewall of the first color die, each color die including a carbon nanotube provided therein; and then
   forming upper electrodes on and contracting the color photo diode.

8. The method of claim 7, wherein the carbon nanotube has a multi-wall or a single-wall structure.

9. An image sensor comprising:
   a color photo diode formed on a substrate, the color photo diode including a plurality of color dies for selectively filtering external light comprising a first color die, a second color die formed on and contacting the first color die at a first lateral sidewall thereof and a third color die formed on and contacting the first color die at a second lateral sidewall thereof, and a plurality of carbon nanotubes provided in the color dies for transferring electrons generated in the color dies by external light.

10. The image sensor of claim 9, further comprising:
    a contact plug formed in the substrate;
    a lower electrode electrically connected to the contact plug, wherein the color photodiode is formed on and contacts the lower electrode; and
    an upper electrode formed on the color photo diode.

11. The image sensor of claim 9, wherein the carbon nanotube has a weight ratio of 0.1 to 10% as compared to the color dies.

12. The image sensor of claim 9, wherein the carbon nanotube is 50 nm to 2 μm in length.

13. The image sensor of claim 9, wherein the carbon nanotube is 0.4 nm to 10 nm in wall thickness.

14. The image sensor of claim 9, wherein the color dies each comprise a conductive polymeric material.

* * * * *